United States Patent [19]
Temerinac

[11] Patent Number: 5,887,036
[45] Date of Patent: Mar. 23, 1999

[54] LOGICAL BLOCK FOR A VITERBI DECODER

[75] Inventor: Miodrag Temerinac, Gundelfingen, Germany

[73] Assignee: Deutsche ITT Industries GmbH, Freiburg, Germany

[21] Appl. No.: 729,672

[22] Filed: Oct. 3, 1996

[30] Foreign Application Priority Data

Oct. 21, 1995 [EP] European Pat. Off. ............. 95116616

[51] Int. Cl.⁶ ................................................ H03M 13/12
[52] U.S. Cl. ......................... 375/341; 371/43.6; 371/43.7
[58] Field of Search .................................... 375/262, 341; 371/43.6, 43.7, 43.8

[56] References Cited

U.S. PATENT DOCUMENTS

| | | | |
|---|---|---|---|
| 4,972,484 | 11/1990 | Theile et al. ............................ | 704/227 |
| 5,068,859 | 11/1991 | Collins et al. .......................... | 371/43.7 |
| 5,233,629 | 8/1993 | Paik et al. ............................... | 375/262 |
| 5,272,706 | 12/1993 | Park ....................................... | 371/43.7 |
| 5,363,408 | 11/1994 | Paik et al. ............................... | 375/261 |
| 5,432,803 | 7/1995 | Liu et al. ................................ | 371/43.6 |
| 5,432,820 | 7/1995 | Sugawara et al. ...................... | 375/341 |
| 5,541,955 | 7/1996 | Jacobsmeyer ........................... | 375/222 |

OTHER PUBLICATIONS

Convolutional Codes and Their Performace in Communication Systems, IEEE Transactions on Communications Technology, vol., COM–19, No. 5, Andrew J. Viterbi, Oct. 1971, pp. 751–772.

*Primary Examiner*—Stephen Chin
*Assistant Examiner*—Jeffrey W. Gluck
*Attorney, Agent, or Firm*—Plevy & Associates

[57] ABSTRACT

A logical block is disclosed for decoding a data sequence encoded by a convolutional code, in which a given number of states are to be evaluated. These given states are assigned the given number of state memories which store an associated path and an accumulated distance value. The given number of state memories are associated with parallel processing blocks which each have, as the smallest group to be processed in parallel, two state memories to be read from first and second parallel processing blocks, and two state memories to be written into third and fourth parallel processing blocks. Optimum memory organization permits simple parallel processing and reduction in circuit complexity.

25 Claims, 6 Drawing Sheets

LOGICAL BLOCK FOR A VITERBI DECODER

FIELD OF THE INVENTION

The present invention generally relates to signal decoding and more particularly to a logical block for decoding a signal which is encoded by means of a convolutional code defined at the receiving end.

BACKGROUND OF THE INVENTION

The present invention relates to a logical block for decoding a signal which is encoded by means of a convolutional code defined at the receiving end at each sampling instant by one out of N possible states. These N possible states are also referred to as a "data channel", because all N possible states at the receiving end must be evaluated and thus correspond to a predetermined data channel, so to speak. This specific encoding technique is described in detail, for example, in an article by A. J. Viterbi entitled "Convolutional Codes and Their Performance in Communication Systems", IEEE Transactions on Communications Technology, Vol. COM-19, No. S. October 1971, pages 751 to 772. A. J. Viterbi developed an efficient algorithm for carrying out maximum-likelihood detection of such convolutional codes. Such an algorithm is commonly referred to as the Viterbi algorithm or "Viterbi decoding". At the transmitting end, the redundancy of arbitrary data sequences is increased by appending additional data. Protection of the data to be transmitted or stored is not achieved by incorporating an internal redundancy, but the redundancy is selectively added to the data. This makes it possible to transmit arbitrary data sequences in protected form, whereby convolutional coding is universally applicable. One application in the consumer-electronics field is the protection of digitized audio data which are either transmitted in any form or originates from a digital storage medium which is error-prone because of its high storage capacity.

At the receiving end, a probability analysis is made over a plurality of received data words to determine which is the most likely data sequence, which then corresponds to the original information. Erroneous decoded data do not only affect a single bit of the respective data sequence, but the perturbing effect is distributed over a wide range of the data sequence. Thus, the effect on the individual data word remains relatively small, so that the decoder can reconstruct the correct, error-free contents of the original signal to make them available at its output for further processing.

The logical blocks for implementing a Viterbi decoder are very large, since not only a large range of the received and reconstructed data sequence needs to be stored, but also the data sequences that would have arisen if the currently received data words had been meant differently at the transmitting end and were misinterpreted due to errors or disturbances.

In the Viterbi decoding process, all N possible receive states are examined at each sampling instant as to how well they match the received data. This is done by comparing theoretical expected values with the received data words. Each of the N possible states is assigned a fixed digital expected value which depends on the respective Viterbi encoding technique used. The comparison between the received data words and the expected values is made using a distance or difference computation. The smaller the distance value, the higher the probability that the state currently being examined is actually assigned to the received data words. By continuously accumulating the distance values, the probability consideration is extended to the sequence of already received data words, so that the most likely sequence will, in the course of time, have the least accumulated distance value. Through this cumulative evaluation, a single error "disappears" in the sum of errors.

The continuous evaluation of the added distance values thus results in a large number of data sequences with different probabilities, which must be updated after each data clock pulse at the latest. The individual data sequence is referred to as a "path". In graphical form, cf., for example, FIGS. 5 and 7, the individual paths can be represented in a trellis diagram. The trellis diagram has a horizontal time axis with the successive sampling instants, while the vertical direction represents the N different states in a sort of row arrangement. According to the received data, the transitions from one state to the next are evaluated by determining the respective distance between expected value and received value. Since each state can be reached from at least two preceding states, a selection is made in the sense that in the case of multiple transitions, only the respective transition with the smaller or the same accumulated distance value is used. In the trellis diagram, the graphic sequence of the individual transitions represents the respective path. If the accumulated distance values are entered at the intersections of the trellis, the most likely path is readily apparent from the trellis diagram. The individual paths tend to differ initially, but for relatively old sampling instants, they merge into a single path which is obviously free from errors, i.e., which contains the sequence of original, error-free states. It can thus be assumed that the states in this range are correct, so that the original data, hereinafter also called "candidates", can be determined therefrom by inverse Viterbi coding. Thus, at each sampling instant, the most likely candidate is determined, which is added to the sequence of candidates already determined, so that the sequence of original data is restored.

This short description of the Viterbi decoding technique shows that a great number of data have to be processed, stored, and reloaded in real time, since for each of the N possible states, both the associated paths and the accumulated difference values must be determined and stored. In each cycle, besides the determination of the new distance values, of the accumulated distance values, and of the new transitions, reloading the data of all stored paths takes place. This is readily apparent from the trellis diagrams of FIGS. 5 and 7.

It is, therefore, an object of the invention to provide a logical block of reduced circuit complexity for a flexible Viterbi decoder which is suitable for incorporation into a monolithic integrated signal-processing circuit and for processing high data rates.

SUMMARY OF THE INVENTION

The present invention is a logical block for decoding a data sequence encoded by means of a convolutional code whose data channel to be transmitted is defined at each instant of reception by one out of a number of possible states. The logical block includes a given number of state memories, each storing an associated path and an accumulated distance value. The given number of state memories are associated with parallel processing blocks, in each of which the first state memory and the second state memory are read from and the third state memory and the fourth state memory are written into. The first, second, third, and fourth state memory, to be processed in parallel, are the smallest group in a parallel processing block, each of the first, second, third, and fourth state memory being linked via four distinct transitions.

The present invention further includes control and arithmetic hardware for determining new contents of the given number of state memories from first and second data sequences received by way of a stored table and a respective first and second delay device. The control and arithmetic hardware further includes a distance computer, operator hardware, and selection hardware.

The distance computer computes new first and second distance values for the group including each of the first through fourth state memories by comparing the first and second data sequences with expected first and second data values stored in the table and assigned to a respective one of the four distinct transitions. The distance computer further calculates accumulated distance values for each of the four distinct transitions.

The operator hardware selects, within the group including each of the first through fourth state memory, one of two possible transitions for each of the third and fourth state memory, depending on a smaller of the accumulated distance value, and determining a given candidate from the oldest transition of the associated path.

The selection hardware is utilized to determine a minimum distance value from a plurality of the accumulated distance value, and thereby to select the transition whose associated candidate is delivered as an output bit.

With the above hardware, writing new contents into each of the third and fourth state memories of the current group of state memories takes place, particularly for the fourth state memory yet to be read from in a subsequent group of the state memories stored in the table, via the first and second delay devices. The first and second delay devices serve to compensate for the time difference between the reading of old contents and the writing of new contents in the current group of state memories.

BRIEF DESCRIPTION OF THE DRAWINGS

The invention will be better understood with reference to the following illustrative and non-limiting drawings, in which.

DETAILED DESCRIPTION OF THE INVENTION

The present invention provides an advantageous architecture for a Viterbi decoder which permits a substantial reduction in circuit complexity. Through the architecture, the heavy data traffic in the decoder is so organized that the simultaneous data traffic in the logical block remains limited to a narrow space. This is achieved by an optimum storage organization through which the great number of data bus lines near the individual state memories can be substantially reduced by means of electronic switches or multiplexers, while only a minimum of data lines is needed for the more remote data buses. This also simplifies the address arithmetic units since a control signal locked to a system clock suffices to switch the electronic switches. Through the entirety of the features recited in the claims, an optimum memory organization is achieved.

Preferred embodiments relate to the formation of the distance values using systematic properties. The distance computation is further simplified by approximation methods. The resolution of the distance determination is increased by an advantageous formation of ranges, without the need to process additional signal bits. This increases noise suppression, particularly at high noise levels, and yields a substantial improvement in quality at only little additional cost.

Figure 1:
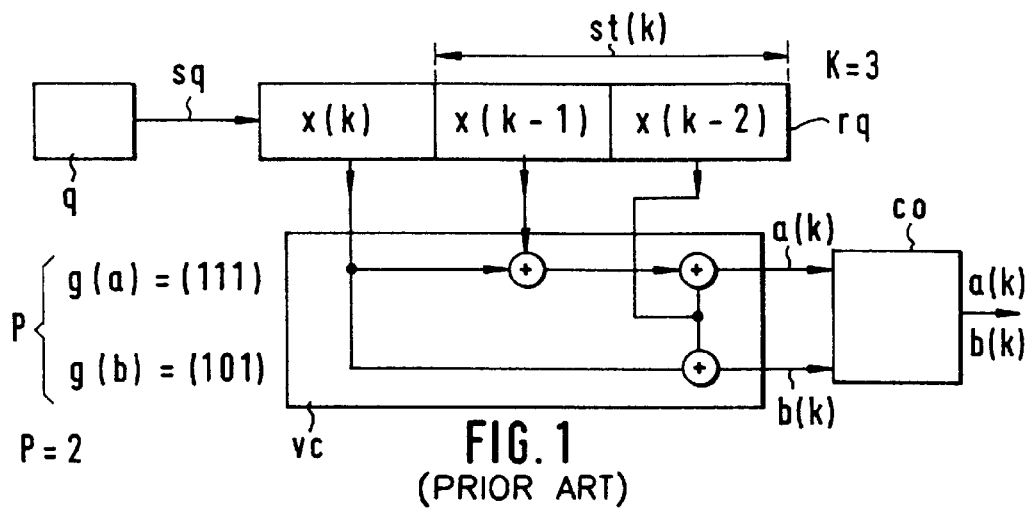
FIG. 1 shows schematically a prior-art circuit for forming a convolutional code.

FIG. 1 shows a prior-art circuit for forming a convolutional code. A data source q generates an original data sequence sq, which is written into a shift register rq of length K=3. The length K of the shift register is generally greater. The data sequence sq stored in the shift register contains the three successive bits or data values $x(k-2)$, $x(k-1)$, and $x(k)$, the latter being the youngest bit. The individual sampling instants are hereinafter denoted by k. In accordance with P=2 coding polynomials, new code words $a(k)$ and $b(k)$ are formed from the stored data values. These code words are formed in the encoder vc by simple addition of the stored data according to the functions g(a) and g(b). The a- and b-code words formed at the instant k are converted to serial form by means of a combinational circuit co, e.g., a multiplexer, and are outputted as a coded data sequence a, b. In the coding process, at least two code words a, b are formed at each sampling instant k; in more sophisticated encoders, however, even greater numbers of, including four code words can be formed.

In the coding and decoding technique, the data sequence stored in the shift register rq plays an essential part, and this is referred to as "state st(k)" at the instant k. The respective state st(k) is formed by the existing data sequence, i.e., by the data up to instant k−1, because the newly added bit (k) has yet to be evaluated.

Figure 2:
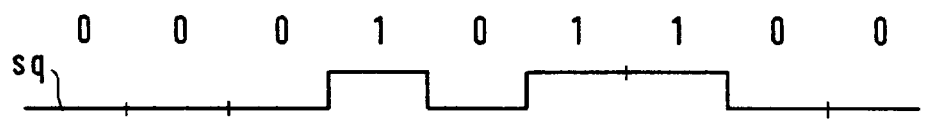
FIG. 2 shows pulse graphs for the circuit of FIG. 1.
Figure 2:
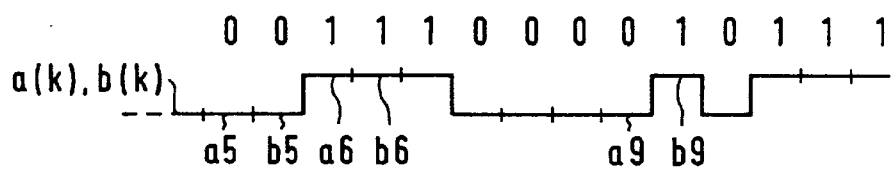
Figure 2:
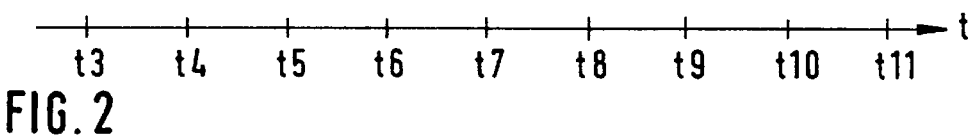

FIG. 2 shows schematically with the aid of a timing diagram how the convolutional coded bit sequence $a(k)$, $b(k)$ is formed from the original data sequence sq in accordance with the polynomials of FIGS. 1. It can be seen that the new bit sequence a, b has twice the bit rate of the original bit sequence sq. The code words a, b formed at the respective instants are given.

Figures 3, 4:
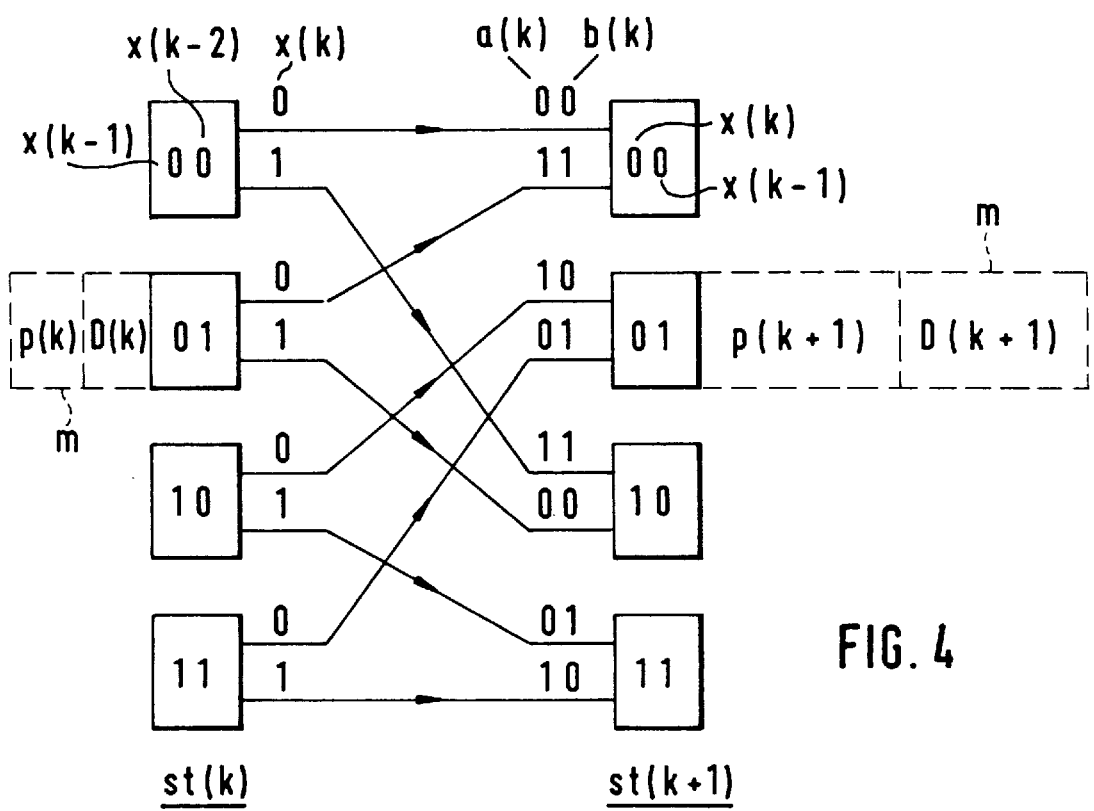
FIG. 3 shows data and state sequences for the circuit of FIG. 1.
FIG. 4 shows a scheme with N=4 states and the associated transitions for the circuit of FIG. 1.

In FIG. 3, the formation of the data sequence of FIG. 2 is shown in a slightly different manner, namely over the respective contents of the shift register rq and the resulting code words $a(k)$, $b(k)$. From the respective state st(k) and the newly added bit $x(k)$, the code words are formed in accordance with the two polynomials g(a), g(b). This is shown for the instants t5 to t11 of FIG. 2. On each sampling clock pulse, the contents of the shift register rq are shifted by one place, so that the newly added bit $x(k)$ will move into the state range st(k) and will be shifted on until it reaches the end of the shift register length K=3 and leaves the shift register.

Another representation of the Viterbi encoding technique is illustrated in FIG. 4. It also corresponds to the polynomials of FIG. 1, and thus to the coding in the Viterbi encoder vc. The representation shows eight different state blocks, which are composed of the four possible current states st(k) and the four possible subsequent new states st(k+1). The scheme looks exactly the same if the past state st(k−1) is shown on the left-hand side and the current state st(k) on the right-hand side. Each of the state blocks is assigned one possible bit combination of a state st(k) or st(k+1). The individual state blocks are arranged in an ascending or descending bit sequence.

The circuit blocks on the left-hand and right-hand sides are interconnected by directed lines, which symbolize that only particular subsequent states can be reached from each state. This becomes apparent, for example, if the corresponding data sequence sq of FIG. 1 is inserted. The left-hand state blocks st(k) correspond precisely to the situation of the shift register rq of FIG. 1, with the newly added bit x(k) assigned to the respective transition line and entered at the right of the state block. If the current state is 00, for example, a newly added 0 bit will also produce the state 00. If the newly added bit x(k) is 1, however, the new state will change to the bit sequence 10. From the scheme it is apparent that each new state can follow from two different states. The a- and b-code words a(k), b(k) assigned to each transition are shown on the right-hand side of the scheme, and are located right next to the associated transition. Different polynomials g(a), g(b) of different encoding techniques do not change the basic structure of the state scheme; only the coded values a, b at the individual transitions change as the polynomials change.

Figure 5:
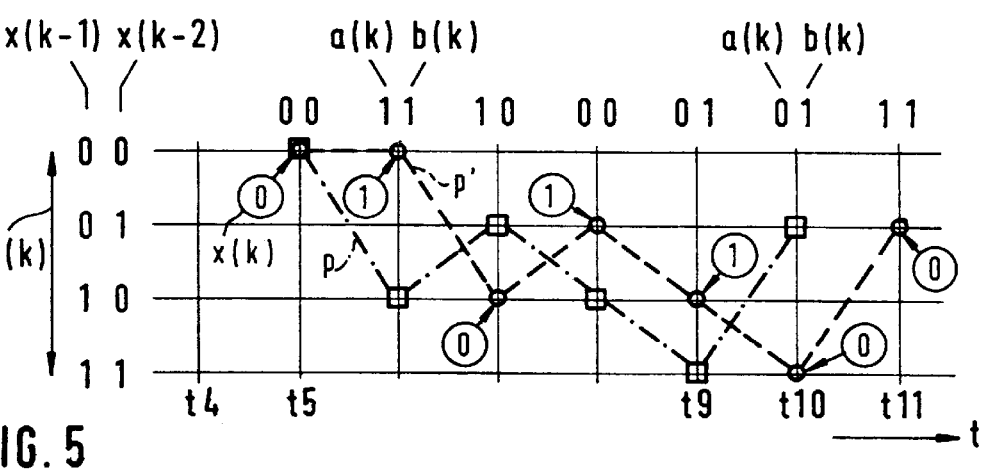
FIG. 5 shows a trellis diagram for the circuit of FIG. 1.

FIG. 5 shows the encoding of the data sequence of FIG. 2 in a trellis diagram, which, as mentioned above, is very useful in encoding or decoding. The individual states st(k) are represented in rows, and the horizontal axis is the time axis t. According to the different sampling instants k, different states are reached one after the other, with all successive states connected by a so-called path p, p'. Above the trellis diagram, the a- and b-code words are given for each instant k. The connections between the individual states, i.e., the path, form a serrated curve. The trellis diagram of FIG. 5 shows two parallel paths p and p', which depend on whether the state in the shift register rq is viewed as in FIG. 1 or whether a previous state is assumed. In FIG. 5, the path p', corresponds exactly to the condition of FIG. 1 and FIG. 2. Where the path p' intersects the respective trellis intersection, the bit value of the original data sequence sq has been entered in a circle. Since the time axes of FIG. 2 and FIG. 5 are identical, the relationship between the path p' and the original bit sequence sq and the coded signal a, b is readily apparent.

Figure 6:
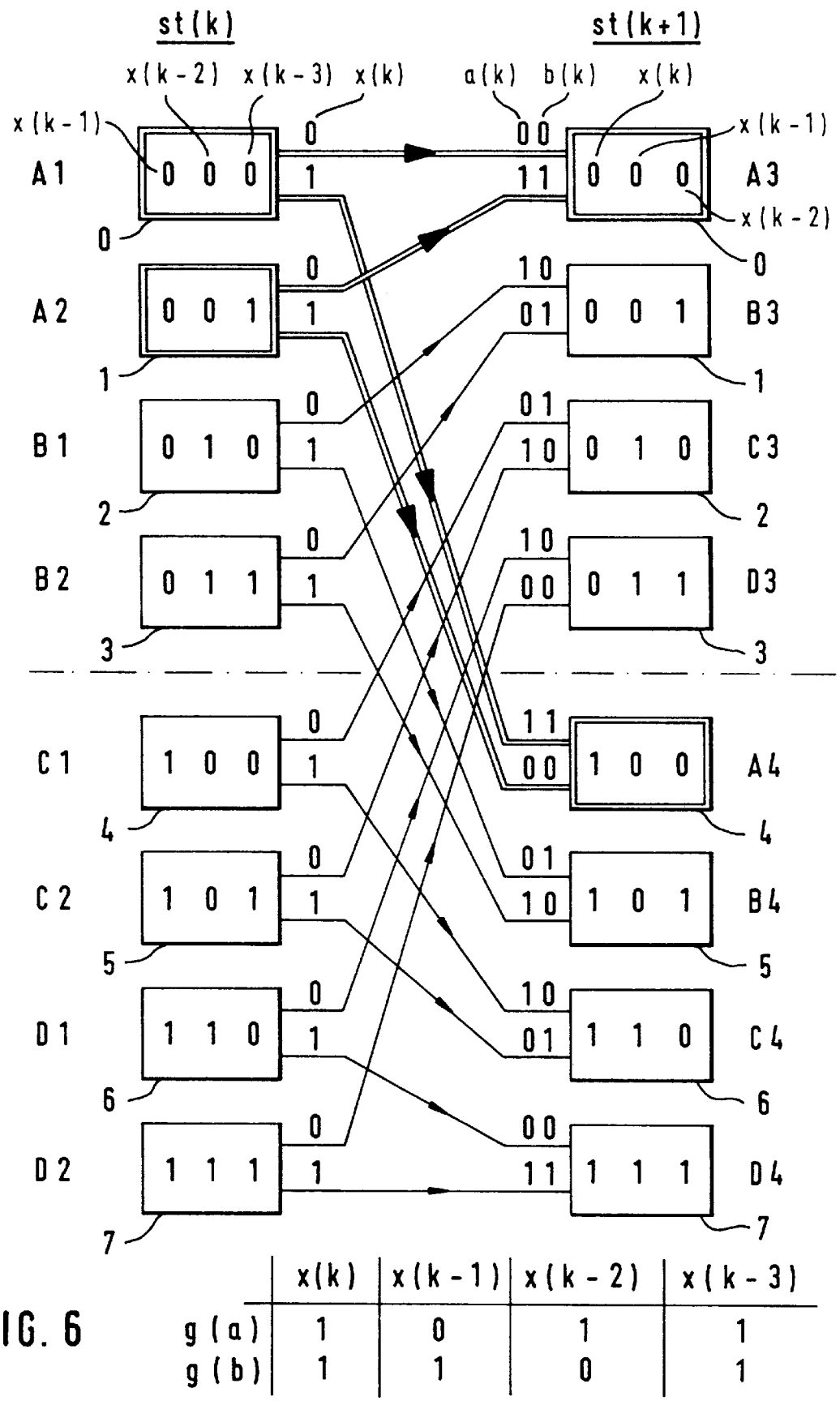
FIG. 6 shows a scheme for N=8 states with a memory analysis according to the invention.

FIG. 6 shows another state scheme in which the individual states have three bits. This gives N=8 possible states st(k) and just as many for the subsequent state st(k+1). Shown below the diagram are the two associated polynomials g(a) and g(b). Although the state diagram is more extensive than the state diagram of FIG. 2, it shows correspondences in essential points, which are utilized for the invention. Again, groups of four state blocks are connected by four respective transitions. The state blocks which belong together are denoted by identical capital letters, the state blocks A being set off.

Figure 7:
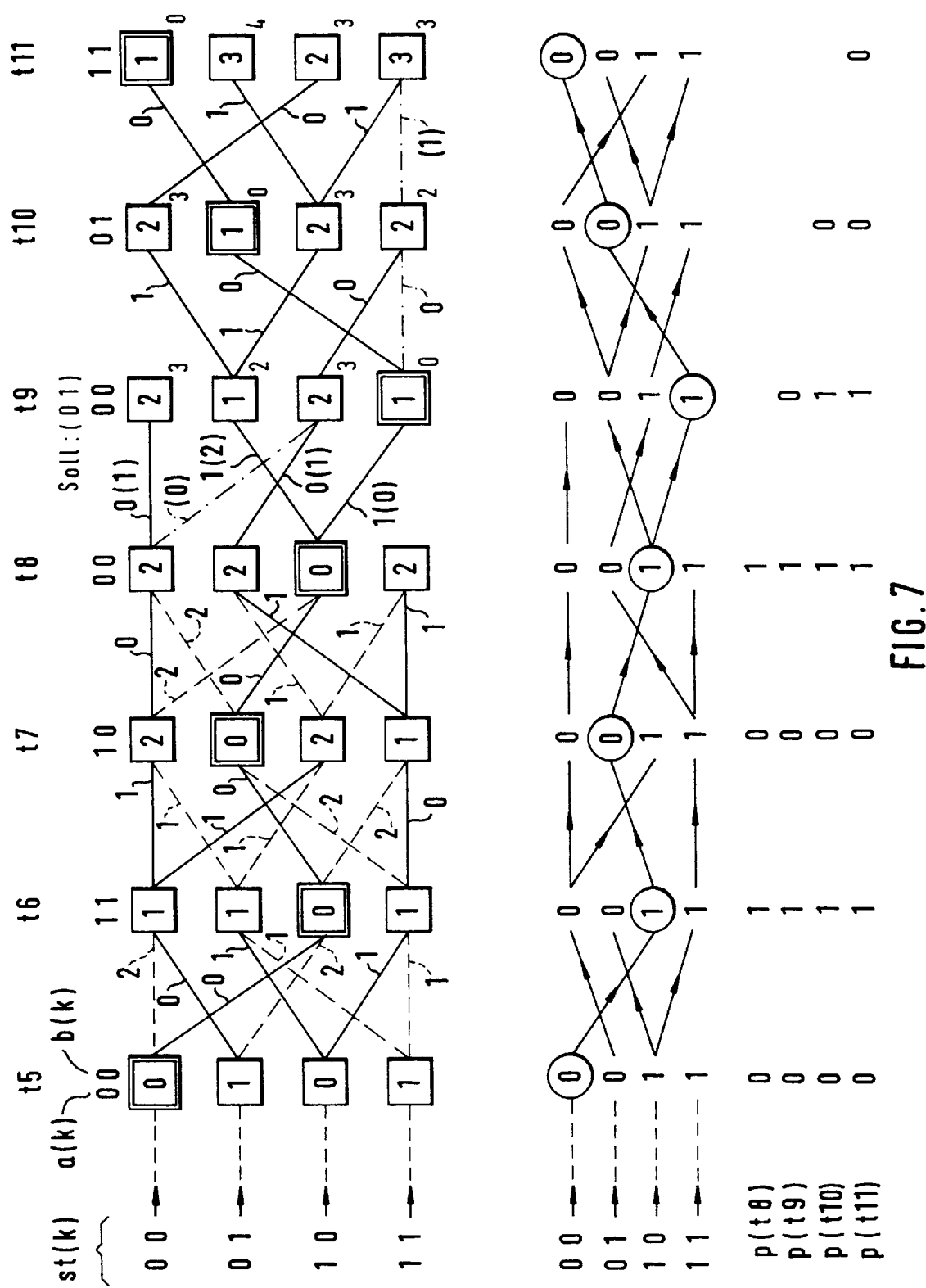
FIG. 7 shows two detailed trellis diagrams referring to FIG. 2.

FIG. 7 shows two detailed trellis diagrams which must be seen in conjunction with FIGS. 1 to 5 and relate to the same sampling instants t5 to t11. The original data sequence sq of FIG. 2 is to be encoded by means of the polynomials g(a) and g(b) of FIG. 1. In the time range t5 to t8 all transitions which are possible according to FIG. 4 are shown. In FIG. 7, the receiving end is considered, which cannot be certain that the received coded data a, b are correct, so that according to Viterbi, all transitions and states have to be examined. Expected code values a, b which follow from the state diagram of FIG. 4, are assigned to the respective transition and are compared with the received code values a(k), b(k), which are given above the diagram of FIG. 7. If the expected code words and the received code words are identical, the error value 0 is obtained for this transition. If equality exists in the case of one code word and inequality in the case of the other, the resulting error corresponds to the value 1. If the two code words differ, the error has the value 2. Since each trellis intersection can be reached via two transitions, the transition having the higher error value is excluded. In FIG. 7, this transition is shown dashed, and the selected transition is shown as a solid line. The individual trellis intersections are rectangular and contain the accumulated error value. At the instant t7, for example, the error values 2, 0, 2, and 1 have accumulated in the four states 00 to 11. At the instant t11, the corresponding error values are 1, 3, 2, and 3. It is apparent that the path starting from the state 00 at the instant t11 is probably the correct path, because altogether it has the least errors. The associated trellis intersections have been set off as rectangles with double lines.

To represent the effect of an error, instead of the correct signal b=1, an incorrect signal b=0 was received in FIG. 7 at the instant t9. Thus, the error value 1 occurs in the correct path at the instant t9 for the first time, while the state located thereabove detects an error-free transition. If no error had occurred at the instant t9, other accumulated error values would have resulted, which are given at the respective trellis intersection on the lower right.

The selection of the transitions depends on which transition provides the least accumulated error. It is quite possible that the respective transition error is the greater one. From the diagram of FIG. 7 it can also be seen that some paths have no continuation toward younger time values, i.e., they "break off". On the other hand, it can be seen that if the individual paths are traced back in time, all paths merge into a single path, which is then to be regarded as the most likely one. For example, when tracing back the paths from the instant t11, one will get into the correct path at the instant t0 at the latest.

The above trellis diagram is again shown in the lower part of FIG. 7, with the trellis intersections showing not the accumulated error values, but the associated bit values. For the sake of clarity, the excluded transitions, shown dashed in the upper diagram, have been omitted in the lower diagram. The bit values shown at the trellis intersections follow from the respective transition, see also FIG. 4. This reconstructed bit value is identical with the associated bit value of the original data sequence sq. At this point the effect of the Viterbi encoding has been reversed, which corresponds to the desired decoding.

The reconstructed bit sequences of the most likely path (p) from instant t8 to instant t11 are shown at the bottom of FIG. 7.

Figure 8:
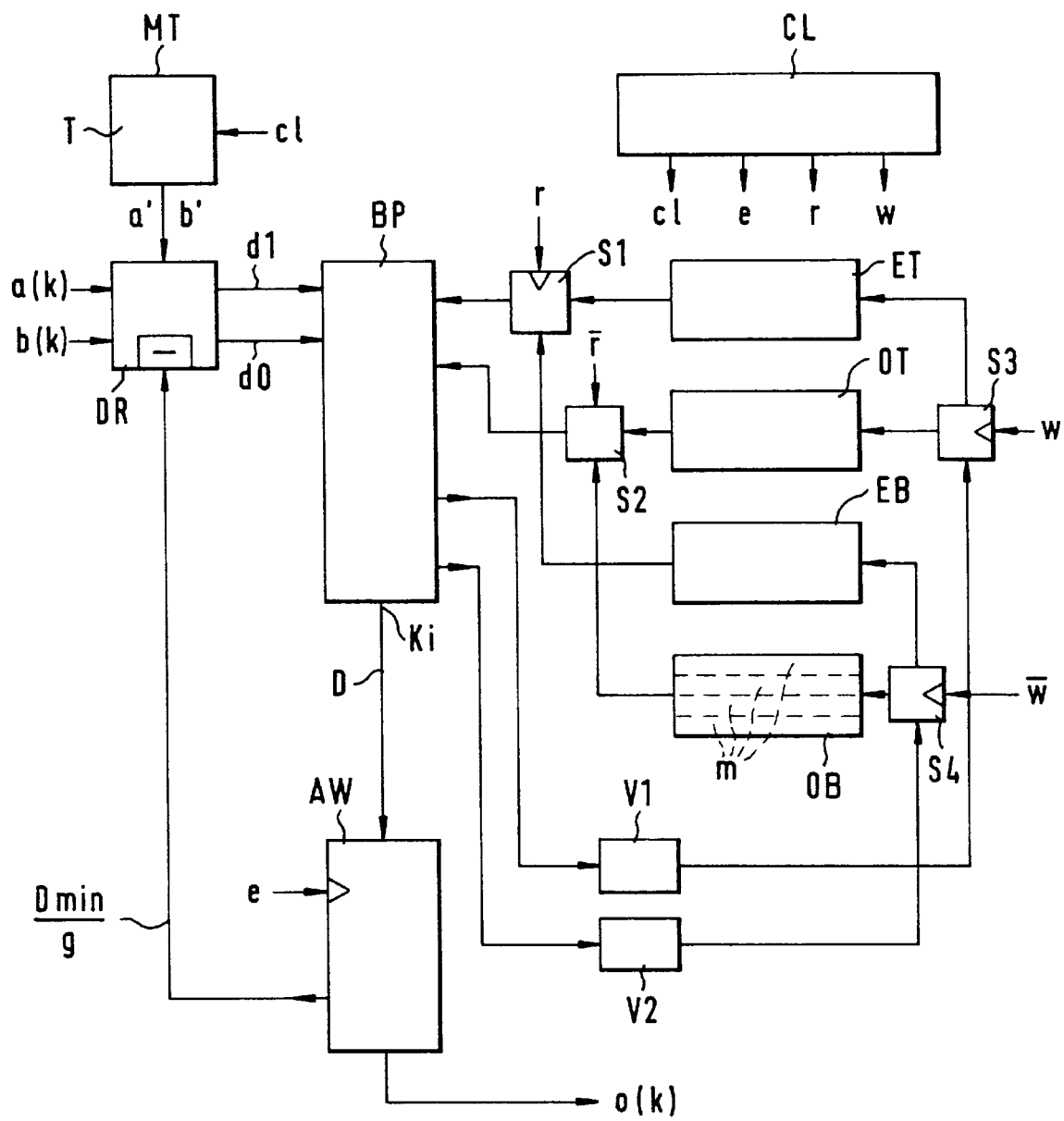
FIG. 8 shows the architecture of a logical block according to the invention.

FIG. 8 shows schematically the logical block of a Viterbi decoder according to the invention. The architecture takes into account that the basic operations can be performed essentially in parallel. Reference is again made to the state scheme of FIG. 6. The state blocks A1 to A4, which are set off there, form a closed group which contains all exchangeable information for the Viterbi operation. Associated with each state block are memory devices m (cf. FIG. 4) for the respective path p and the respective accumulated distance value D, which are not shown in the state scheme of FIG. 6 for the sake of simplicity, and which are known per se. The first and second state memories A1, A2 contain the information which is needed to form the new contents of the third and fourth state memories A3, A4. According to the basic rules of the Viterbi decoding technique, logical operations are performed in an operator BP, whose data inputs are fed with the contents of the first and second state memories A1, A2. To form the new accumulated distance values D, the operator is also supplied, from a distance computer DR, with the respective 1 and 0 distance values d1, d0 for each of the two transitions, which determine the distance to the logic 0 and 1 levels. These are absolute distance values, which follow from the analog received levels of the code words a(k) and b(k) and possibly further code words. For distance computation, expected values a' and b', and others are required, which can be read from a table T in a table memory MT for the respective state st(k) being examined. The stored table may be reprogrammed if necessary, or may be present in different sets so as to be able to process different Viterbi codes. Finally, the operator BP, writes the new contents via delay devices V1, V2 into the third and fourth state memories A3, A4.

When organizing the N state memories m according to the invention, it is possible to use only a single set of N state memories and nevertheless process one or more groups in parallel. This is made possible by the delay devices V1, V2, which, for example, retain the information to be written into the fourth state memory A4 until the old contents of the latter have been read for processing in another group, in FIG. 6 group C. The first state memory A1 poses no problems, since the new contents have to be written into the third state memory A3, which has already been read as the first state memory A1. This corresponds to a conventional write-back of modified memory contents into the same memory. The second state memory A2 is also unproblematic, since it must be loaded with new contents only in the subsequent group B so that the read and write operations will not result in any conflict situation.

If the second group B is considered, it can be seen that it behaves quite similarly to the first group A, but it is not so readily apparent that the state memory B3 does not require a delay device during writing. By contrast, a delay device is again required in the case of the state memory B4 because the equal-position state memory C2 is read only in the subsequent group C. It is even possible to process the A and B groups and the C and D groups in parallel in the same manner, whereby the processing speed is doubled. Since real Viterbi decoders have to process 64 states, for example, such parallel processing blocks prove to be extremely advantageous, the more so if the amount of circuitry required is only insignificantly increased.

The memory organization with the associated read and write buses becomes particularly simple if the N state memories m, arranged according to binary ascending states, are assigned the numbers 0 to N−1 and then divided as follows: the even-numbered state memories from 0 to N/2 into a first area ET (=even top); the odd-numbered state memories from 1 to N/2−1 into a second area OT (=odd top) the even-numbered state memories from N/2 to N−2 into a third area Es (=even bottom); and the odd-numbered state memories from N/2+1 to N−1 into a fourth area OB (=odd bottom).

After the formation of these areas, new numbering can be undertaken, in which each area begins with a start value (e.g., 0) and ends with an end value N/4−1. All members of a group (e.g., group A) then have the same number, which also is to be regarded as an increment address. This memory organization is used in the logical block of FIG. 8. By means of electronic switches or multiplexers S1 to S4, the respective data buses required are switched between the individual areas and the operator BP. A clock generator CL provides the necessary control clocks e, r, w and the system clock cl. The incrementing and its control are not shown in FIG. 8.

The operator BP also feeds the accumulated distance values D and the associated candidates Ki to a selection circuit AW, which determines the least distance value Dmin, and thus the associated candidate Ki which is delivered as a reconstructed output data value o(k). The minimum distance value Dmin is multiplied by a weighting factor 1/g, (e.g., ¼) and fed to a subtrahend input of the distance computer DR, this value Dmin being continuously subtracted from the accumulated distance value D to prevent overflow.

Figure 9:
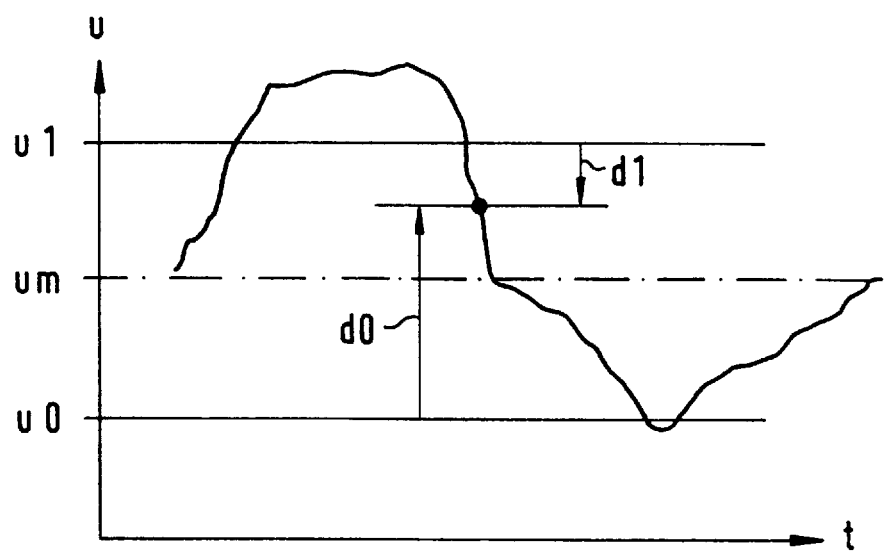
FIG. 9 shows the distance-value determination by a time diagram.

The absolute distance values d1 and d0 are determined in accordance with the representation of FIG. 9. The received analog signal r contains the digital information as a logic 0 or a logic 1 according to the predetermined voltage levels u1 and u0. The respective deviation value d0 or d1 from this voltage level provides the above 0 or 1 distance, which is quantized according to the resolution of an A/D conversion. The average voltage level urn forms a neutral value which is used in the puncturing procedure. This, as is well known, reduces the data rate to be transmitted when Viterbi decoding is performed.

Figure 10:
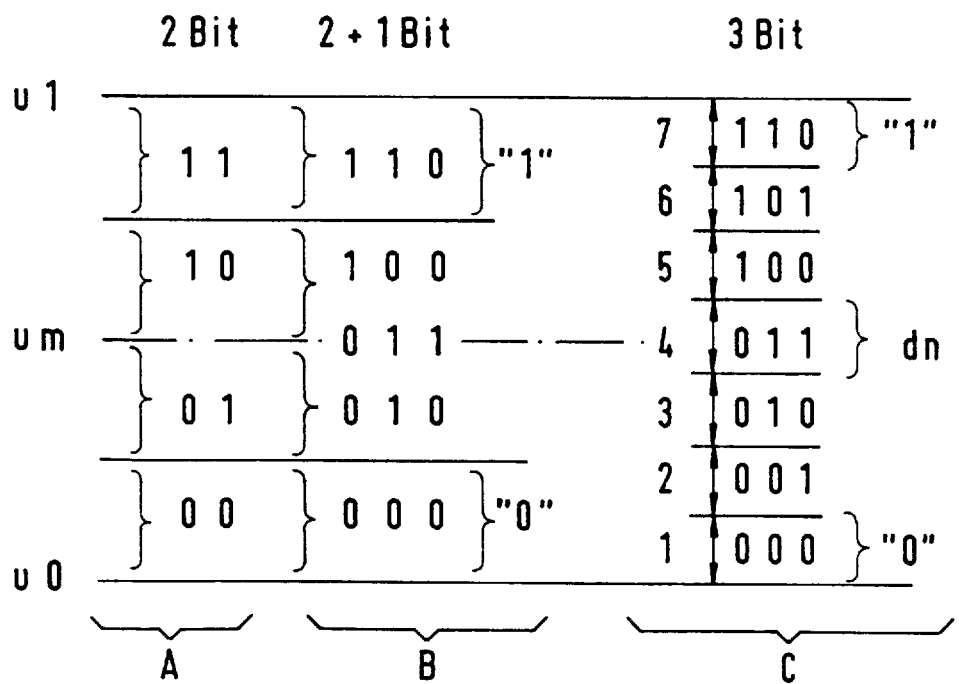
FIG. 10 shows an advantageous formation of ranges during the distance-value determination.

Since, as shown in FIG. 10, the predetermined voltage range between the levels u0 and u1 can be decomposed by a predetermined number of bits into an even number of ranges only (cf. range A), this applies to both the absolute distances and the relative distances. The relative distances have nothing to do with the actual voltage differences but only denote the quantized relative positions by means of binary numbers. A neutral value or neutral distance dn, which denotes precisely the average voltage um, can only be formed by means of an additional bit. This, however, does not improve the resolution, cf. range B with 2.1 bits. In order that the additional bits can also be used for the entire logic range from 0 to 1 to improve the resolution, the range is divided into an odd number, e.g., $2^B-1$, of quantization ranges by multiplying the determined distance values d0, d1 by $(2^B-1)/2^B$. Thus, the individual ranges are regularly reduced by a small value, so that an additional range is obtained. This provides the odd-numbered quantization ranges. B is the number of bits with which the individual quantization ranges are encoded; the resolution of the A/D converter is finer than the resolution with the B-bit relative distance information. In any case, the middle one, 2B/2−1, of the quantization ranges (1 to 7, see FIG. 10, range 011), has the same binary value 011 as the neutral position dn.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

What is claimed is:

1. A logical block for decoding a data sequence encoded by means of a convolutional code whose data to be transmitted is defined at each instant of reception by one out of a number of possible states, said logical block comprising:

a given number of state memories, each storing an associated path and an accumulated distance value, said given number of state memories being associated with parallel processing blocks, each of which, as a smallest group, including first, second, third, and fourth state memories to be processed in parallel, said first state memory and said second state memory being read from and said third state memory and said fourth state memory being written into, each of said first, second, third, and fourth state memories being linked via four distinct transitions; and control and arithmetic means for determining new contents of said given number of state memories from received first and second values of said data sequence by means of a stored table and respective first and second delay devices, said control and arithmetic section including:

distance computing means for computing new first and second distance values for the group including each of said first through fourth state memories by comparing said first and second data sequence values with expected first and second data values stored in said table and assigned to a respective one of said four distinct transitions, and calculating accumulated distance values for each of said four distinct transitions;

an operator means for selecting, within the group including each of said first through fourth state memories, one of two possible transitions for each of said third and fourth state memories, depending on a smaller of said accumulated distance values, and determining a given candidate symbol from the oldest transition of said associated path; and selection means for determining a minimum distance value from a plurality of said accumulated distance values corresponding to respective transitions into states corresponding to said third and fourth state memories, and thereby selecting the transition whose associated said candidate symbol is delivered as an output bit;

wherein writing of new contents into each of said third and fourth state memories of the current group of state memories takes place, particularly for said fourth state memory yet to be read from in a subsequent group of state memories, via said first and second delay devices, wherein each said respective delay device is directly coupled to said operator means and to a plurality of said state memories which serve to compensate for the time difference between the reading of old contents and the writing of new contents in the in the current group of state memories.

2. A method for decoding a data sequence encoded by means of a convolutional code whose data to be transmitted is defined at each instant of reception by one out of a number of possible states, said method comprising the steps of:

storing with a given number of state memories an associated path and an accumulated distance value;

associating said given number of state memories with parallel processing blocks, each of which, as a smallest group including first, second, third, and fourth state memories to be processed in parallel, said first state memory and said second state memory being read from and said third state memory and said fourth state memory being written into;

linking each of said first, second, third, and fourth state memories via four distinct transitions;

determining new contents of said given number of state memories from received first and second values of said data sequence by means of a stored table and respective first and second delay devices;

computing new first and second distance values for the group including each of said first through fourth state memories by comparing said first and second data sequence values with expected first and second data values stored in said table and assigned to a respective one of said four distinct transitions;

calculating accumulated distance values for each of said four distinct transitions;

selecting, within the group including each of said first through fourth state memories, one of two possible transitions for each of said third and fourth state memories, depending on a smaller of said accumulated distance values corresponding to respective transitions into states corresponding to said third and fourth state memories;

determining a given candidate symbol from the oldest transition of said associated path;

determining a minimum distance value from a plurality of said accumulated distance values, thereby selecting the transition whose associated said candidate symbol is delivered as an output bit; and writing of new contents into each of said third and fourth state memories of the current group of state memories taking place, particularly for said fourth state memory yet to be read from in a subsequent group of state memories, via said first and second delay devices, which serve to compensate for the time difference between the reading of old contents and the writing of new contents in the current group of state memories, and arranging said given number of state memories according to binary ascending states, so that in each of the groups of said given number of state memories. said first and second state memories form adjacent pairs and said third and fourth state memories being said given number divided by two storage positions apart.

3. The method in accordance with claim 2, wherein for said given number of state memories arranged according to binary ascending states, said method further comprises the steps of assigning the numbers 0 to said given number minus 1 in ascending order, and dividing into four like areas in accordance with said numbers 0 to said given number minus 1.

4. The method in accordance with claim 3, wherein said like areas comprise a first area formed from even numbered ones of said given number of state memories numbered from 0 to said given number divided by two, minus two;

a second area formed from odd numbered ones of said given number of state memories numbered from 1 to said given number divided by two, minus 1;

a third area formed from even numbered ones of said given state memories numbered from said given number divided by two to said given number minus two; and a fourth area formed from odd numbered ones of said given number of state memories numbered from said given number divided by two, plus 1, to said given number minus 1.

5. The method in accordance with claim 4, further comprising the step of addressing said given number of state memories via an appropriate one of said first, second, third and fourth areas and an incrementable address, said incrementable address defining the relative position of the state memory in the respective one of said first, second, third and fourth areas, said relative position beginning at a start value of 0 and ending at an end value of said given number divided by four, minus 1.

6. The method in accordance with claim 5, further comprising the step of selecting, during an evaluation cycle, the state memories in each said first through fourth areas, and incrementing said incremental address from said start value to said end value.

7. The method in accordance with claim 6, wherein each of said first, second, third and fourth areas is connected to a separate read bus and a separate write bus, and the selection of the four read buses and the four write buses is made by one of a switch and multiplexer.

8. The method in accordance with claim 2, further comprising the step of determining said first distance value and said second distance value from a pair of said received first and second said data sequence values as distances to the logic 0 and 1 positions.

9. The method in accordance with claim 2, further comprising the step of determining an analog or logic distance range between the logic 0 and 1 position, by the received first and second said data sequence values and dividing said analog or logic distance range into a given odd number of quantization ranges.

10. The method in accordance with claim 9, further comprising the step of successively encoding said quantization ranges by means of a certain number B of bits, with a given middle of said quantization range serving as a neutral distance value.

11. The method in accordance with claim 10, wherein said first and said second distance values are multiplied by a given factor which is less than the value one, to form a product which is present as a binary coded digit.

12. The method in accordance with claim 11, wherein for said binary coded digit, said certain number B of bits are used to form relative distance values which are assigned to individual said quantization ranges.

13. The method in accordance with claim 12, wherein an offset value is added to the product, which is not shortened in terms of its number of bits, said offset value being so preset that said middle quantization range is symmetrical with respect to said neutral distance value.

14. The method in accordance with claim 2, wherein each of said first and second distance values is determined by an approximation method.

15. A logical block for decoding a data sequence encoded by means of a convolutional code whose data to be transmitted is defined at each instant of reception by one out of a number of possible states, said logical block comprising:

a given number of state memories, each storing an associated path and an accumulated distance value, said given number of state memories being associated with parallel processing blocks, each of which, as a smallest group, including first, second, third, and fourth state memories to be processed in parallel, said first state memory and said second state memory being read from and said third state memory and said fourth state memory being written into, each of said first, second, third, and fourth state memories being linked via four distinct transitions; and control and arithmetic means for determining new contents of said given number of state memories from received first and second values of said data sequence by means of a stored table and respective first and second delay devices, said control and arithmetic section including:

distance computing means for computing new first and second distance values for the group including each of said first through fourth state memories by comparing said first and second data sequence values with expected first and second data values stored in said table and assigned to a respective one of said four distinct transitions, and calculating accumulated distance values for each of said four distinct transitions;

an operator means for selecting, within the group including each of said first through fourth state memories, one of two possible transitions for each of said third and fourth state memories, depending on a smaller of said accumulated distance values, and determining a given candidate symbol from the oldest transition of said associated path; and selection means for determining a minimum distance value from a plurality of said accumulated distance values corresponding to respective transitions into states corresponding to said third and fourth state memories, and thereby selecting the transition whose associated said candidate symbol is delivered as an output bit;

wherein writing of new contents into each of said third and fourth state memory of the current group of state memories takes place, particularly for said fourth state memory yet to be read from in a subsequent group of state memories, via said first and second delay devices, which serve to compensate for the time difference between the reading of old contents and the writing of new contents in the current group of state memories, and wherein said given number of state memories are arranged according to binary ascending states, so that in each of the groups of state memories, said first and second state memories form adjacent pairs and said third and fourth state memories are said given number divided by two storage positions apart.

16. The logical block in accordance with claim 15, wherein said given number of state memories arranged according to binary ascending states are assigned the numbers 0 to said given number minus 1 in ascending order, and divided into four like areas in accordance with said numbers 0 to said given number minus 1, said like areas including a first area formed from even numbered ones of said given number of state memories numbered from 0 to said given number divided by two, minus two;

a second area formed from odd numbered ones of said given number of state memories numbered from 1 to said given number divided by two, minus 1;

a third area formed from even numbered ones of said given state memories numbered from said given number divided by two to said given number minus two; and a fourth area formed from odd numbered ones of said given number of state memories numbered from said given number divided by two, plus 1, to said given number minus 1;

wherein said given number of state memories are addressed via the appropriate one of said first, second, third and fourth areas and an incrementable address, said incrementable address defining the relative position of the state memory in the respective one of said first, second, third and fourth areas, said relative position beginning at a start value of 0 and ending at an end value of said given number divided by four, minus 1.

17. The logical block in accordance with claim 16, wherein during an evaluation cycle for selecting the state memories in each of said first through fourth areas, said control and arithmetic means increments said incremental address from said start value to said end value, and the selection of each said first through fourth area takes place according to a sequence determined in said control and arithmetic means.

18. The logical block in accordance with claim 17, wherein each of said first, second, third and fourth areas is connected to a separate read bus and a separate write bus, and the selection of the four read buses and the four write buses is made by one of a switch and multiplexer controlled by said control and arithmetic means.

19. The logical block in accordance with claim 15, wherein said distance computing means determines an initial said distance value and said first distance value from a pair of the received first and second said data sequence values as distances to the logic 0 and 1 positions.

20. The logical block in accordance with claim 15, wherein an analog or logic distance range between the logic 0 and 1 position, determined by said received first and second said data sequence values, is divided into a given odd number of quantization ranges.

21. The logical block according to claim 20, wherein said quantization ranges are successively encoded by means of a certain number B of bits, with a given middle of said quantization range serving as a neutral distance value.

22. The logical block in accordance with claim 20, wherein each of said first and said second distance values for the group are multiplied by a given factor which is less than the value one to form a product which is present as a binary coded digit.

23. The logical block in accordance with claim 22, wherein for said binary coded digit, said certain number B of bits are used to form relative distance values which are assigned to individual said quantization ranges.

24. The logical block in accordance with claim 23, wherein an offset value is added to the product, which is not shortened in terms of its number of bits, said offset value being preset so that said middle quantization range is symmetrical with respect to said neutral distance value.

25. The logical block in accordance with claim 15, wherein each of said first and second distance values is determined by an approximation method.

\* \* \* \* \*